United States Patent [19]

Aigo

[11] Patent Number: 5,012,935
[45] Date of Patent: May 7, 1991

[54] SUPPORT FRAME FOR SUPPORTING A SEMICONDUCTOR WAFER CARRIER

[76] Inventor: Seiichiro Aigo, 3-15-13, Negishi, Daito-ku, Tokyo, Japan

[21] Appl. No.: 485,540

[22] Filed: Feb. 27, 1990

[30] Foreign Application Priority Data

Feb. 27, 1989 [JP] Japan .............................. 1-21645[U]

[51] Int. Cl.⁵ ............................................ A47G 19/08
[52] U.S. Cl. .................................................... 211/41
[58] Field of Search ............... 248/176, 163.1; 15/268; 211/41

[56] References Cited

U.S. PATENT DOCUMENTS

| | | | |
|---|---|---|---|
| 3,850,296 | 11/1974 | Hirata | 211/41 |
| 4,569,452 | 2/1986 | Schulke | 211/41 |
| 4,672,509 | 6/1987 | Sperca | 211/41 |
| 4,949,848 | 8/1990 | Kos | 211/41 |

Primary Examiner—Robert L. Wolfe
Attorney, Agent, or Firm—Wegner, Cantor, Mueller & Player

[57] ABSTRACT

A support frame for a semiconductor wafer carrier is disclosed, which comprises a guide means to guide and hold said carrier in position and a wafer stopper means located in the central area of the support frame for washing or other processing of semiconductor wafers housed in a carrier located in a vessel. The respective semiconductor wafers housed in a carrier located in position in the support frame are slightly lifted with the lowermost portion of the wafers abutting against the wafer stopper means to thereby contact the whole surface of the wafers with the liquid in a vessel.

4 Claims, 2 Drawing Sheets

SUPPORT FRAME FOR SUPPORTING A SEMICONDUCTOR WAFER CARRIER

BACKGROUND OF THE INVENTION (1) Field of the Invention

This invention relates to a carrier support frame used for positioning a carrier including therein semiconductor wafers in position within a processing vessel.

(2) Description of the Prior Art

Usually, in a process, for example, for washing semiconductor wafers housed in a carrier, in which process said carrier is immersed in liquid such as pure water or chemical liquid contained in a vessel, a support frame is used for supporting said carrier in position in a vessel. In the case, preferably, a bubbler device is located below the support frame for generating bubbles so as to stir the liquid in a vessel. The respective semiconductor wafers (A) housed in a carrier are located in a groove formed along the inner surface of the carrier, and are supported at their lower parts contacting to the groove portions.

Such a conventional support frame described above has some drawbacks and problems as will be pointed out below. Movability of the liquid in a vessel is inadequate around the wafer lower parts which contact to a carrier groove, and therefore the wafer lower parts will not be contacted sufficiently with the liquid. This will result in haze film or stain film on the wafer lower parts, and for example in case of etching process, insufficiency of etching will occur at the lower parts of wafers, which reduces the productibity of semiconductors.

To solve this problem, an apparatus has been known, for example, in Japanese Utility Model Laid-open Gazette No. 78746/1987, which comprises a means for lifting slightly a series of semiconductor wafers housed in a carrier set in a processing vessel. As shown in FIG. 5 which exemplifies an apparatus such as shown in the above described Gazette, such an apparatus includes a rotary roller (R) which serves to lift and rotate semiconductor wafers (A) housed in a carrier (C) in a vessel. Since the periphery of semiconductor wafer is of a sharp edge, fine dusts will be generated by friction caused between the wafer peripheral edge and a carrier groove. Such fine dusts will provide harmful influence on semiconductor wafers.

SUMMARY OF THE INVENTION

Therefore, an object of the invention is to solve the aforementioned drawbacks of the prior art, and accordingly to provide an improved support frame for supporting a semiconductor wafer carrier which prevents fine dusts from being generated during the process and effects uniform contact of the whole surface of semiconductor wafers with the liquid in a vessel.

In attaining the above object, a support frame according to the present invention comprises guide means for guiding a carrier to a predetermined position in the support frame and for holding four peripheral sides of a carrier, and a wafer stopper means located in its central area in order to lift slightly semiconductor wafers housed in a carrier by abutment of the lowermost portion of the wafers against the wafer stopper means when the carrier is located in position in the support frame.

Since the respective semiconductor wafers housed in a carrier are slightly lifted with the lowermost portion of the wafers abutting against the stopper means when the carrier is set in position, the lower parts of semiconductor wafers do not contact to a groove of the carrier, so that all portions of wafers will sufficiently contact with liquid in a vessel. Also, the respective semiconductor wafers housed in a carrier are processed in a stationary condition in the support frame, so that no friction is caused between a wafer periphery and a carrier groove and thus no fine dusts will be generated.

DETAILED DESCRIPTION OF THE INVENTION AND THE PREFERRED EMBODIMENTS

The invention will now be described with reference to the preferred embodiments. This sort of support frame is used for locating a carrier including semiconductor wafers therein within a rinse vessel or another processing vessel.

Figure 3:
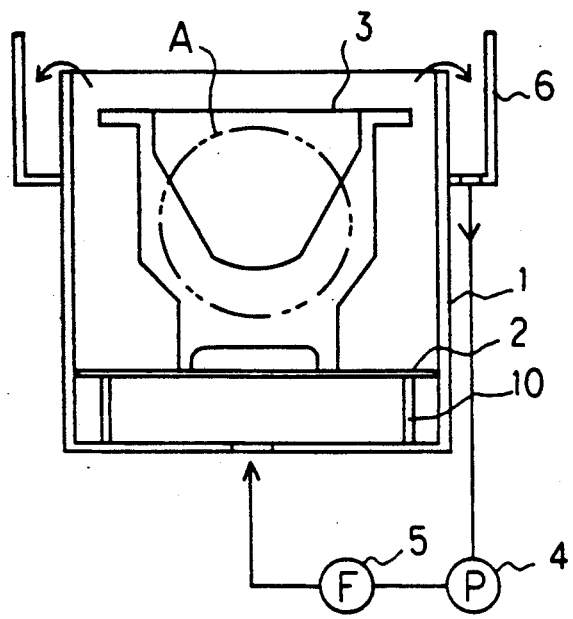
FIG. 3 is a schematic front view showing a carrier supported in a support frame immersed in liquid in a vessel for processing.

FIG. 3 shows an example of washing system which comprises a rinse vessel (1) in which a support frame (2) is positioned, a carrier (3) together with a suitable number of wafers (A) housed in the carrier being supported in the support frame (2). Liquid used for rinse is introduced into the vessel from the bottom portion thereof by way of a pump (4) and a filter (5), and then overflown over the top of the peripheral wall of the vessel to a conduit (6) connected to said pump (4) through a line for circulation.

Figure 1:
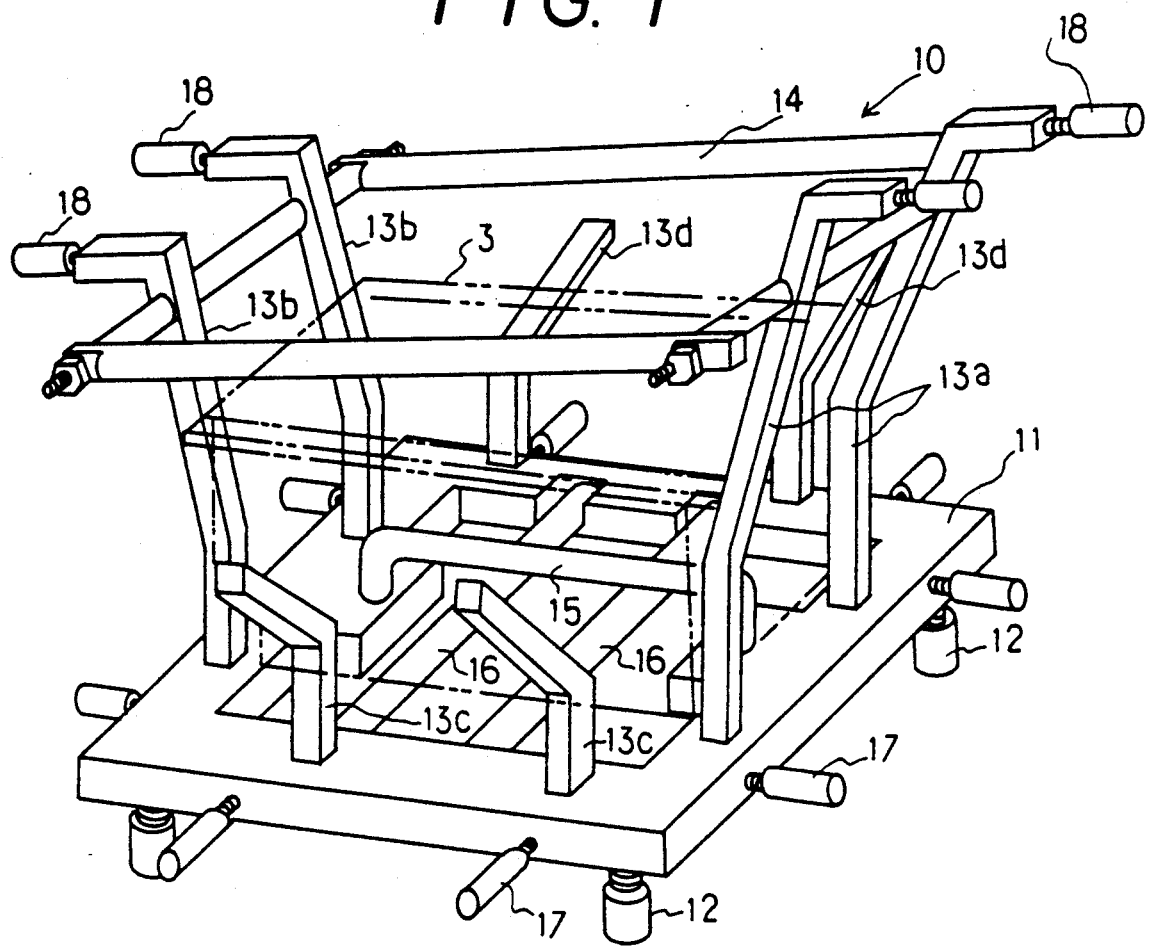
FIG. 1 is a perspective view of an embodiment of a support frame according to the invention.

FIG. 1 shows an embodiment of a support frame (10) for a carrier according to the invention. As shown in FIG. 1, this support frame (10) includes a rectangular or square base plate (11) formed with a central space, said base plate (11) being horizontally positioned and having on its underside foot portions (12) at the four corners thereof. A bubbler device will be desirably disposed under the base plate (11).

The base plate (11) also includes guide members mounted on the upper surface thereof on four sides in order to form guide means for a carrier. The guide means (13) comprises of four pairs of guide rods (13a), (13b), (13c), (13d) disposed at before and behind sides (right and left sides shown in FIG. 1) and at right and left sides. Namely, the respective sides of the base plate (11) are provided with a pair of guide rods. Otherwise, the respective sides of the base plate (11) will be possibly provided with one or more than two guide rods.

The respective guide rods (13a), (13b), (13c), (13d) have a lower vertical part perpendicular to the base plate (11) and an upper outwardly slant part. Thus, upper parts of the guide rods are shaped upwardly divergent and serve to guide a carrier (3) when it is inserted into the support frame. A carrier (3) supported in the support frame (10) is located in position and held with the lower parts of the respective guide rods. The guide rods (13a), (13b) disposed on a pair of opposed sides are preferably upwards elongated more than those on other two sides, and are connected each other with a rectangular frame (14) for reinforcement. Also, the guide rods (13a) and (13b) have a handle portion (18) at the top thereof to facilitate the handling of the support frame.

The feature of the support frame (10) is to have a wafer stopper means (15) in the central area of the base plate (11). The said stopper means (15) extends in the before and behind direction across the central space of the base plate (11) and is projected upwards from the base plate (11) so as to lift slightly the respective semiconductor wafers housed in a carrier relative to the said carrier, as described below. The base plate (11) also has horizontal support rods (16) for receiving foot portions of a carrier to support it thereon. Said support rods (16) extend perpendicular to the stopper means (15) and across the central space of the base plate (11). Although the stopper means (15) is consisted of a bar as shown in FIG. 1, such stopper means will be formed with a pair of bars. The bar or bars forming the stopper means (15) have right-angled bent portions on both ends thereof, and said bar or bars are mounted on the base plate (11) at said bent end portions.

Also, the support frame (10) is preferably provided with stopper rods (17) on the periphery thereof in order to locate the stopper frame (10) in position within a vessel (1). The constituent members of the support frame (10) are made of fluorine resin, quartz or PVC, etc.

Figure 2:
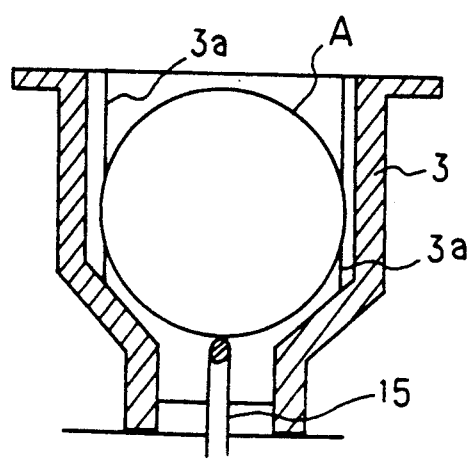
FIG. 2 is a cross-sectional view showing a carrier including semiconductor wafers therein located in a support frame according to the invention.
Figure 4:
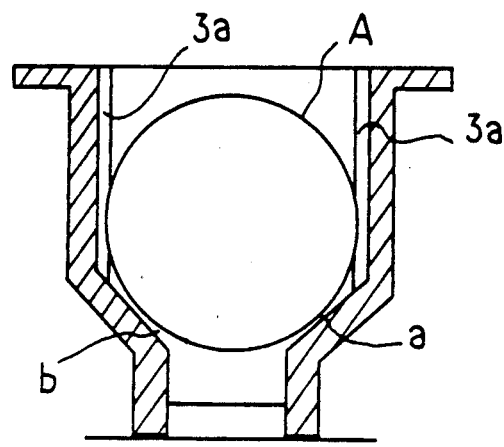
FIG. 4 is a cross-sectional view showing a carrier including semiconductor wafers therein located in a prior art support frame.
Figure 5:
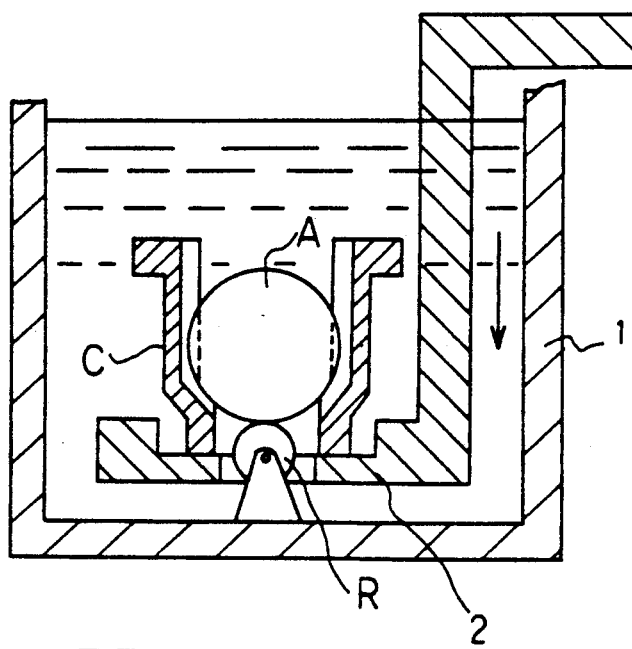
FIG. 5 is also a cross-sectional view showing a carrier and semiconductor wafers housed in the carrier located in another prior art support frame.

In positioning a carrier (3) in the support frame (10), the carrier is guided by the upper slant parts of the guide rods and moved down to the predetermined position. Since there is a space between foot portions of the carrier, the wafer stopper (15) adequately enters the carrier through the said space between the foot portions of the carrier, and thus the respective semiconductor wafers housed in the carrier abut against the wafer stopper (15) at lowermost peripheral portions of the wafers. Accordingly, as shown in FIG. 2, the respective semiconductor wafers are slightly lifted, for example, lifted by 5-10 mm, and thus they do not contact with the lowermost parts (parts a, b shown in FIG. 4) of carrier groove (3a).

Therefore, when a carrier is located in the support frame of the invention, the respective semiconductor wafers housed in a carrier are slightly lifted, so that dead space area (a, b in FIG. 4) is avoided. Thus, all the surface of semiconductor wafers housed in a carrier contact to the liquid contained in a vessel. Also, there is no friction between the periphery of semiconductor wafers and a carrier groove (3a), and therefore no fine dusts are generated. This leads to an effective processing such as washing of semiconductor wafers.

Having now fully described the invention, it will be apparent to one of ordinary skill in the art that many changes and modifications can be made thereto without departing from the spirit or scope of the invention as set forth herein.

What is claimed is:

1. In a support frame for supporting a semiconductor wafer carrier in a vessel for washing or other processing of semiconductor wafers housed in the carrier, said support frame comprising guide means to guide and hold said carrier in position against displacement of the carrier therearound, the improvement wherein said support frame is provided with wafer stopper means located substantially in the central area of the support frame, whereby the respective semiconductor wafers housed in a carrier located in position in the support frame are slightly lifted with the lowermost portion of the semiconductor wafers abutting against said wafer stopper means to thereby effect contact of the whole surface of the respective semiconductor wafers with the liquid contained in a vessel.

2. A support frame set forth in claim 1, wherein said wafer stopper means comprises of a bar having right-angled bent portions on both ends thereof, said bar being mounted on the base plate of the support frame at said bent end portions.

3. A support frame set forth in claim 1, wherein said wafer stopper means comprises of a pair of bars parallel each other having right-angled bent portions on both ends thereof, said pair of bars being mounted on the base plate of the support frame at said bent end portions.

4. A support frame set forth in claim 1, wherein said guide means comprises four sides for receiving therein a wafer carrier, each of said sides being provided with a pair of guide rods, the respective guide rods having a lower vertical part and an upper outwardly slant part.

* * * * *